(12) United States Patent
Kanae

(10) Patent No.: US 6,621,149 B2
(45) Date of Patent: Sep. 16, 2003

(54) SEMICONDUCTOR CHIP PRODUCTION METHOD AND SEMICONDUCTOR WAFER

(75) Inventor: Masaaki Kanae, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/072,679

(22) Filed: Feb. 8, 2002

(65) Prior Publication Data

US 2002/0115232 A1 Aug. 22, 2002

(30) Foreign Application Priority Data

Feb. 16, 2001 (JP) ........................................ 2001-040320

(51) Int. Cl.[7] ........................ H01L 29/04; H01L 31/036
(52) U.S. Cl. ........................................ 257/628; 257/777
(58) Field of Search ........................ 257/79, 627, 628, 257/678, 777, 778

(56) References Cited

U.S. PATENT DOCUMENTS

| | | | | |
|---|---|---|---|---|
| 4,238,848 A | * | 12/1980 | Yamaguchi et al. | 368/276 |
| 5,153,898 A | * | 10/1992 | Suzuki et al. | 378/34 |
| 5,767,571 A | * | 6/1998 | Kimura et al. | 257/668 |
| 6,141,034 A | * | 10/2000 | McCutchen | 348/36 |

FOREIGN PATENT DOCUMENTS

JP   11-233458   8/1999

* cited by examiner

*Primary Examiner*—David Nhu
(74) *Attorney, Agent, or Firm*—Keating & Bennett, LLP

(57) ABSTRACT

A semiconductor chip production method in which, when a semiconductor chip is formed by severing from a semiconductor wafer, a short side of a semiconductor device is arranged and disposed along a direction which is parallel to a crystal orientation direction, and a severing area along the short side of the semiconductor device is formed so that its width is smaller than the width of a severing area along a long side of the semiconductor device. Further, the widths of the severing areas along the long and short sides of the semiconductor devices are formed so that after severing, the ratio between the long sides and the short sides of the semiconductor chips is smaller than the ratio between the long sides and the short sides of the unseparated semiconductor devices. The invention aims at preventing a reduction in the mechanical strength of a rectangular semiconductor chip having vertical and horizontal dimensions that are different from each other, when producing the rectangular semiconductor chip.

2 Claims, 1 Drawing Sheet

CRYSTAL DIRECTION

SEMICONDUCTOR CHIP PRODUCTION METHOD AND SEMICONDUCTOR WAFER

BACKGROUND OF THE INVENTION

1. Field of the Invention

The present invention relates to a semiconductor chip production method and a semiconductor wafer used in the production method, and, more particularly, to an effective technology for use in producing a rectangular semiconductor chip having a vertical dimension and a horizontal dimension which differ from each other.

2. Description of the Related Art

In a semiconductor process, many semiconductor devices which are arranged and disposed on a semiconductor wafer are formed at the same time by, for example, photolithography or vacuum deposition. Severing areas for splitting the semiconductor wafer are formed between the semiconductor devices. By vertically and horizontally cutting severing lines along the central portions of the corresponding severing areas by, for example, dicing, the semiconductor devices are separated from each other to form individual rectangular semiconductor chips.

In order to reduce the cost of the semiconductor chips, the area of each semiconductor chip is reduced. However, as the size of the semiconductor chips becomes smaller, the proportion of the area taken up by the severing areas with respect to the area of the semiconductor wafer increases. Therefore, in order to increase the number of semiconductor chips obtained from the semiconductor wafer, the severing areas need to be made narrower. However, the difficulty of making these severing areas narrower is becoming a problem.

In order to overcome this problem, Japanese Unexamined Patent Application Publication No. 11-233458 discloses a method of narrowing severing areas along long sides of semiconductor devices in order to increase the number of semiconductor chips obtained.

However, by using this method, the severing areas along the long sides of the semiconductor devices are narrowed with respect to the severing areas along short sides of the semiconductor devices. In this situation, the rectangular semiconductor chips obtained by separation from the semiconductor wafer have portions of the severing areas which remain after the severing areas are cut by dicing. Therefore, the ratio between the long sides and the short sides of the severed rectangular semiconductor chips is larger than the ratio between the long sides and the short sides of the semiconductor devices before severing. Consequently, the rectangular semiconductor chips become elongated, thereby resulting in the problem that the mechanical strength of the semiconductor chips becomes weak.

When the severing areas along the long sides of the semiconductor devices are disposed in a direction in which chipping of the semiconductor wafer tends to occur, since the width of the severing areas is small, the chipping reaches the semiconductor devices, thereby damaging the semiconductor devices. This has been a cause of the production of defective semiconductor chips.

SUMMARY OF THE INVENTION

In view of the above-described problems, the present invention provides a semiconductor chip production method and a semiconductor wafer used in the production method in order to overcome the above-described problems and to increase the number of rectangular semiconductor chips obtained from a rectangular semiconductor wafer without reducing the strength of the rectangular semiconductor chips.

To this end, according to one aspect of the present invention, there is provided a method of producing a rectangular semiconductor chip by severing, at severing areas along long sides and along short sides of a plurality of semiconductor devices, a semiconductor wafer having formed thereon the plurality of rectangular semiconductor devices, having the long sides and short sides, arranged in vertical and horizontal directions. The method comprises the steps of forming the short sides of the semiconductor devices on the semiconductor wafer parallel to a crystal orientation direction of the semiconductor wafer; and forming the severing areas along the short sides of the semiconductor devices so that widths thereof are smaller than widths of the severing areas along the long sides of the semiconductor devices.

According to another aspect of the present invention, there is provided a semiconductor wafer having formed thereon a plurality of rectangular semiconductor devices, having long and short sides, arranged in vertical and horizontal directions, and including severing areas along the long sides and the short sides of the semiconductor devices. In the semiconductor wafer, the short sides of the semiconductor devices are formed parallel to a crystal orientation direction of the semiconductor wafer, and widths of the severing areas along the short sides of the semiconductor devices are smaller than widths of the severing areas along the long sides of the semiconductor devices.

By virtue of these measures, when rectangular semiconductor chips are produced by separating the semiconductor devices arranged and disposed on the semiconductor wafer, the ratio between long sides and short sides of the semiconductor chips becomes smaller than the ratio between the long sides and the short sides of the unseparated semiconductor devices. Therefore, the mechanical strength of the semiconductor chips is not reduced. Consequently, when the semiconductor chips are mounted, it is possible to prevent cracking, chipping, or other defects in the semiconductor chips caused by mechanical stress.

By disposing the short sides of the semiconductor devices along a direction which is parallel to an orientation flat, which corresponds to a direction in which chipping of the semiconductor wafer does not easily occur, and by decreasing the widths of the severing areas which are provided along the short sides of the semiconductor devices, the areas of the severing areas of the semiconductor wafer can be made small, thereby making it possible to increase the number of semiconductor chips obtained from the semiconductor wafer.

Other features and advantages of the present invention will become apparent from the following description of embodiments of the invention which refers to the accompanying drawings.

DETAILED DESCRIPTION OF EMBODIMENTS OF THE INVENTION

Hereunder, with reference to FIGS. 1 and 2, a description of an embodiment of a semiconductor chip production method and an embodiment of a semiconductor wafer used in the production method will be given.

Figure 1:
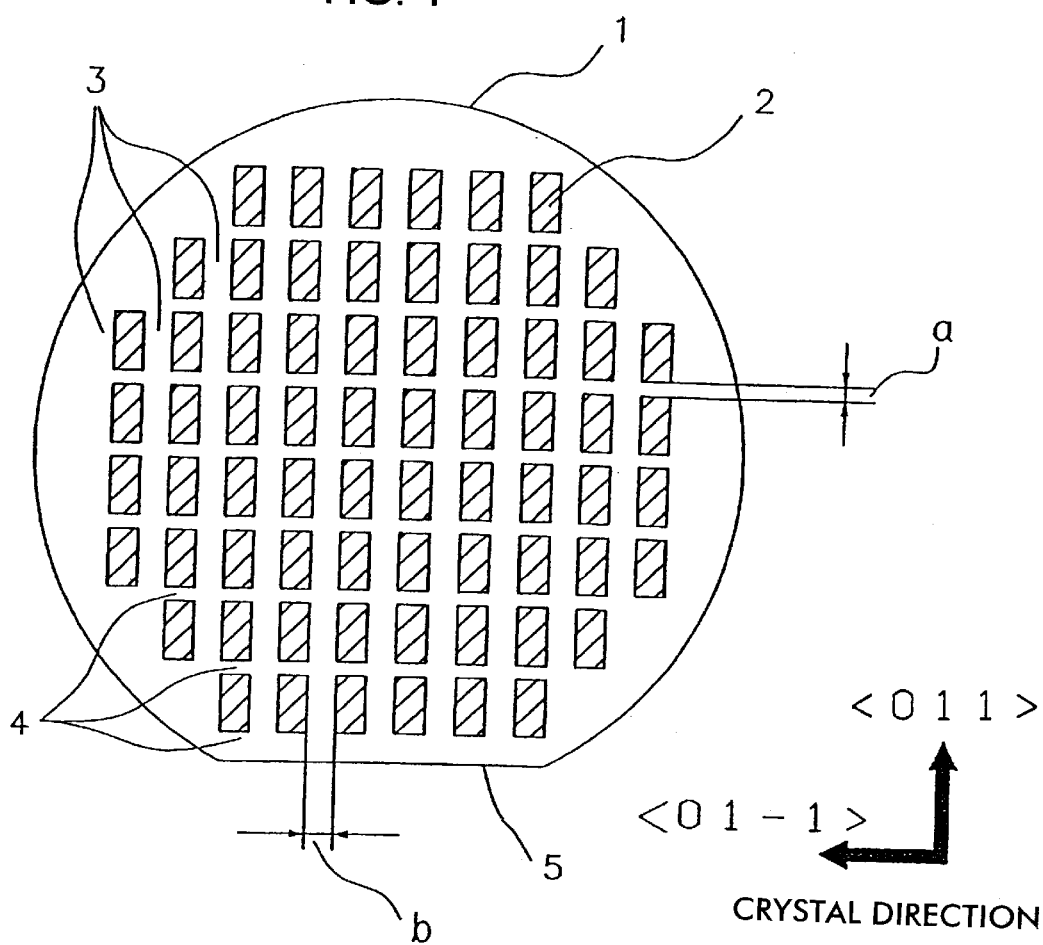
FIG. 1 shows a semiconductor wafer produced and used according to the present invention.

As shown in FIG. 1, an orientation flat 5 is provided on the semiconductor wafer 1, and identifies, for example, the crystal orientation of a semiconductor wafer 1, which is formed of a GaAs-system material and which has a {100} surface as a principal surface. The orientation flat 5 is formed by a cutting operation in a straight line parallel to a crystal orientation <01-1>. Many rectangular semiconductor devices 2, formed on one of the surfaces of the semiconductor wafer 1 by, for example, photolithography or vacuum deposition, are arranged and disposed so that short sides of the semiconductor devices 2 are parallel to the crystal orientation <01-1> direction (i.e., to the orientation flat 5). In order to split these semiconductor devices 2 from the semiconductor wafer 1, long-side severing areas 3, formed along long sides of the semiconductor devices 2, and short-side severing areas 4, formed along the short sides of the semiconductor devices 2, are provided on the semiconductor wafer 1. Accordingly, the short-side severing areas 4 are disposed parallel to the orientation flat 5, while the long-side severing areas 3 are disposed perpendicular to the orientation flat 5.

Here, in the direction parallel to the crystal orientation <01-1> direction of the semiconductor wafer 1 (that is, to the orientation flat 5), little chipping occurs during dicing, and the size of any chipping is small. Therefore, the short-side severing areas 4, which are provided in the direction parallel to the crystal orientation <01-1> direction, can be made narrower than the long-side severing areas 3, which are set so that the largest chipping that occurs at the time of dicing the semiconductor wafer 1 does not affect the semiconductor devices 2. Consequently, since a width a of each short-side severing area 4 can be set smaller than a width b of each long-side severing area 3 (which corresponds to the width of the largest severing area), the total area of the severing areas on the semiconductor wafer 1 is reduced, thereby allowing a large number of semiconductor devices to be disposed, so that it is possible to increase the number of semiconductor chips obtained.

Next, preparing for predetermined dicing operations and using a dicing blade of a predetermined width, a dicing operation is carried out along a center portion of each long-side severing area 3 in order to cut all of the long-side severing areas 3. Then, the semiconductor wafer 1 is turned around 90 degrees in order to carry out a dicing operation along a center portion of each short-side severing area 4, so that all of the short-side severing areas 4 are cut. This makes it possible to split many rectangular semiconductor chips from the semiconductor wafer 1.

Figure 2:
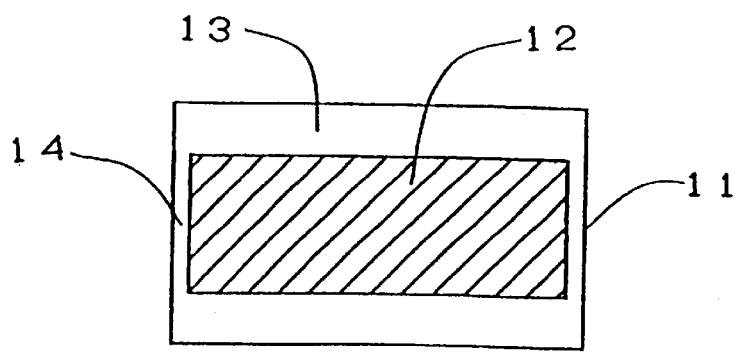
FIG. 2 shows a semiconductor chip that is provided by the present invention.

One of the split rectangular semiconductor chips is shown in FIG. 2. As shown in FIG. 2, in a semiconductor chip 11, in order to make the ratio between a long side and a short side of the semiconductor chip 11 smaller than the ratio between a long side and a short side of a semiconductor device 12, a remaining portion 13 of a long side severing area, which is produced after dicing, is made wide, while a remaining portion 14 of a short side severing area, which is produced after dicing, is made narrow. Therefore, it is possible to make the ratio between the long side and the short side of the semiconductor chip 11 smaller than the ratio between the long side and the short side of the semiconductor device 12.

Accordingly, it is possible to restrict a reduction in the mechanical strength of the semiconductor chip 11, caused by forming the semiconductor chip 11 into an elongated shape, by preventing the ratio between the long side and the short side of the semiconductor chip 11 from becoming large.

In the foregoing description of an embodiment of the present invention, when the severing of the semiconductor chips from the semiconductor wafer is described, only dicing is mentioned as a method of severing. However, the semiconductor chips can be severed from the semiconductor wafer using a scribing method as well.

As can be understood from the foregoing description, according to the present invention, when semiconductor chips are formed by severing from a semiconductor wafer, the short sides of the semiconductor devices are arranged and disposed along a direction which is parallel to the crystal orientation <01-1> direction (that is, to the orientation flat), and the severing areas along the short sides of the semiconductor devices are formed so that the widths thereof are smaller than the widths of the severing areas along the long sides of the semiconductor devices. Therefore, it is possible to restrict a reduction in the mechanical strength of the semiconductor chips while increasing the number of semiconductor chips that are obtained.

Although the present invention has been described in relation to particular embodiments thereof, many other variations and modifications and other uses will become apparent to those skilled in the art. Therefore, the present invention is not limited by the specific disclosure herein.

What is claimed is:

1. A semiconductor wafer having formed thereon a plurality of rectangular semiconductor devices, having long and short sides, arranged in vertical and horizontal directions, and including severing areas along the long sides and the short sides of the semiconductor devices, wherein the short sides of the semiconductor devices are formed parallel to a crystal orientation direction of the semiconductor wafer, and wherein widths of the severing areas along the short sides of the semiconductor devices are smaller than widths of the severing areas along the long sides of the semiconductor devices.

2. A semiconductor wafer having formed thereon a plurality of rectangular semiconductor devices, having long and short sides, arranged in vertical and horizontal directions, and including severing areas along the long sides and the short sides of the semiconductor devices, wherein the short sides of the semiconductor devices are formed parallel to a crystal orientation direction of the semiconductor wafer, and wherein widths of the severing areas along the short sides and the long sides of the semiconductor devices are formed so that after severing, the ratio between the long sides and the short sides of the semiconductor chips is smaller than tile ratio between the long sides and the short sides of the unseparated semiconductor devices.

* * * * *